(12) United States Patent
Choi et al.

(10) Patent No.: US 9,029,493 B2
(45) Date of Patent: *May 12, 2015

(54) ORGANOPOLYSILOXANE

(71) Applicant: LG Chem, Ltd., Seoul (KR)

(72) Inventors: Bum Gyu Choi, Daejeon (KR); Min Jin Ko, Daejeon (KR); Myung Sun Moon, Daejeon (KR); Jae Ho Jung, Daejeon (KR); Dae Ho Kang, Daejeon (KR); Min Kyoun Kim, Daejeon (KR); Byung Kyu Cho, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/275,439

(22) Filed: May 12, 2014

(65) Prior Publication Data

US 2014/0319575 A1 Oct. 30, 2014

Related U.S. Application Data

(63) Continuation of application No. PCT/KR2012/010069, filed on Nov. 26, 2012.

(30) Foreign Application Priority Data

Nov. 25, 2011 (KR) .................. 10-2011-0124660
Nov. 26, 2012 (KR) .................. 10-2012-0134552

(51) Int. Cl.

| | |
|---|---|
| C08G 77/04 | (2006.01) |
| C09K 11/00 | (2006.01) |
| H01L 33/00 | (2010.01) |
| H01L 33/56 | (2010.01) |
| C08G 77/18 | (2006.01) |
| C08L 83/04 | (2006.01) |
| H01L 23/29 | (2006.01) |

(52) U.S. Cl.
CPC ............... *H01L 33/56* (2013.01); *C08G 77/04* (2013.01); *C08G 77/18* (2013.01); *C08L 83/04* (2013.01); *H01L 23/296* (2013.01)

(58) Field of Classification Search
None
See application file for complete search history.

(56) References Cited

U.S. PATENT DOCUMENTS

| | | | |
|---|---|---|---|
| 4,046,795 A | 9/1977 | Martin | |
| 5,530,075 A * | 6/1996 | Morita et al. | 525/431 |
| 8,080,614 B2 * | 12/2011 | Morita et al. | 525/100 |
| 8,258,502 B2 * | 9/2012 | Yoshitake et al. | 257/40 |
| 8,299,186 B2 * | 10/2012 | Sagawa et al. | 525/478 |
| 2002/0161140 A1 * | 10/2002 | Yoneda et al. | 526/90 |
| 2004/0241927 A1 * | 12/2004 | Kato et al. | 438/202 |
| 2005/0212008 A1 * | 9/2005 | Miyoshi | 257/100 |
| 2006/0073347 A1 * | 4/2006 | Morita et al. | 428/447 |
| 2006/0081864 A1 * | 4/2006 | Nakazawa | 257/98 |
| 2007/0112147 A1 * | 5/2007 | Morita et al. | 525/478 |
| 2009/0099321 A1 * | 4/2009 | Yoshitake et al. | 525/475 |
| 2009/0118440 A1 * | 5/2009 | Nakanishi et al. | 525/478 |
| 2009/0123764 A1 * | 5/2009 | Morita et al. | 428/446 |
| 2010/0224906 A1 | 9/2010 | Kashiwagi et al. | |
| 2011/0147955 A1 * | 6/2011 | Kashiwagi | 257/791 |
| 2013/0009201 A1 * | 1/2013 | Ko et al. | 257/100 |
| 2013/0187176 A1 * | 7/2013 | Ko et al. | 257/88 |

FOREIGN PATENT DOCUMENTS

| | | | | |
|---|---|---|---|---|
| JP | 2011-225715 | | 11/2011 | |
| KR | 1020070067717 A | | 6/2007 | |
| KR | 10-2011-0087243 | | 8/2011 | |
| KR | 1020110087243 A | | 8/2011 | |
| WO | WO 2011090364 A2 * | | 7/2011 | H01L 23/29 |

OTHER PUBLICATIONS

"Direct Synthesis and Characterization of Crosslinked Polysiloxanes via Anionic Ring-Opening Copolymerization with Octaisobutyl-Polyhedral Oligomeric Silsesquioxane and Octamethylcyclotetrasiloxane"; Li, et al.; Journal of Applied Polymer Science 2006, vol. 102, pp. 3848-3856.

"A Novel and Facile Method for Direct Synthesis of Cross-Linked Polysiloxanes by Anionic Ring-Opening Copolymerization with Ph12-POSS/D4/Ph8D4"; Polymer 2005, vol. 46, pp. 5317-5323.

* cited by examiner

*Primary Examiner* — Robert S Loewe
(74) *Attorney, Agent, or Firm* — McKenna Long & Aldridge, LLP

(57) ABSTRACT

Provided is an organopolysiloxane and its use. The organopolysiloxane may exhibit excellent processibility and workability. In addition, when the organopolysiloxane is used as an encapsulant, it exhibits excellent light extraction efficiency, crack resistance, hardness, thermal and shock resistance and an adhesive property. Moreover, the organopolysiloxane may provide an encapsulant exhibiting stable durability and reliability under severe conditions for a long time and having no whitening and surface stickiness.

14 Claims, No Drawings

ORGANOPOLYSILOXANE

This application is a Continuation Bypass of International Application No. PCT/KR2012/010069, filed Nov. 26, 2012, and claims the benefit of Korean Application No. 10-2011-0124660, filed on Nov. 25, 2011, and Korean Application No. 10-2012-0134552, filed on Nov. 26, 2012, all of which are hereby incorporated by reference in their entirety for all purposes as if fully set forth herein.

TECHNICAL FIELD

The present application relates to an organopolysiloxane and its use.

BACKGROUND ART

A representative method of preparing an organopolysiloxane is a method of dehydrating and condensing organosilane or organosiloxane having a hydrolysable group such as an alkoxy group. For example, in the patent document 1, a method of preparing an organopolysiloxane by dehydrating and condensing a disoloxane, a dialkoxydiorganosilane and a trialkoxyorganosilane is disclosed.

However, according to the above method, it is difficult to effectively prepare an organopolysiloxane having a desired structure. For example, according to the above method, it is difficult to prepare a polysiloxane having a sufficiently-long linear structure which is composed of a bifunctional siloxane unit. In addition, according to the above method, it is also difficult to realize a structure in which a silicon atom in a bifunctional siloxane unit is directly connected to a silicon atom in a trifunctional siloxane unit via an oxygen atom.

In addition, according to the above method, it is difficult to remain functional groups involved in a hydrolysis and condensation, for example, a hydrolysable functional group such as an alkoxy group and a hydroxyl group, in the prepared organopolysiloxane.

PRIOR ART DOCUMENT

<PATENT DOCUMENT 1> U.S. Pat. No. 4,046,795

DISCLOSURE

Technical Problem

The present application provides an organopolysiloxane and its use.

Technical Solution

Illustrative organopolysiloxane may be represented as an average composition formula of Formula 1.

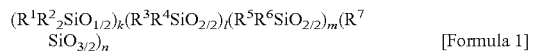
[Formula 1]

In Formula 1, $R^1$ is a monovalent hydrocarbon group having at least two carbon atoms, $R^2$ is an alkyl group having 1 to 4 carbon atoms, $R^3$ is an aryl group having 6 to 25 carbon atoms, $R^4$ is an alkyl group having 1 to 20 carbon atoms, an alkenyl group having 2 to 20 carbon atoms or an aryl group having 6 to 25 carbon atoms, $R^5$ and $R^6$ are each independently an alkyl group having 1 to 20 carbon atoms, an alkenyl group having 2 to 20 carbon atoms or an aryl group having 6 to 25 carbon atoms, $R^7$ is an alkyl group having 1 to 20 carbon atoms or an aryl group having 6 to 25 carbon atoms, k is a positive number, l and m are each independently a positive number, n is a positive number, and (l+m)/n is 5 or more.

The expression "organopolysiloxane is represented as a certain average composition formula" used herein means that the organopolysiloxane is a single component represented as the certain average composition formula, or a mixture or reaction product of at least two components, and the average of compositions of respective components in the mixture or reaction product is represented as the certain average composition formula.

The term "monovalent hydrocarbon group" used herein may refer to a monovalent residue derived from an organic compound composed of carbon and hydrogen or a derivative thereof. The monovalent hydrocarbon group includes one or at least two carbon atoms, and may be, for example, a monovalent hydrocarbon group having 1 to 25 or 2 to 25 carbon atoms. The monovalent hydrocarbon group may be, for example, an alkyl group, an alkenyl group or an aryl group.

The term "alkyl group" used herein may refer to, unless specifically defined otherwise, an alkyl group having 1 to 20, 1 to 16, 1 to 12, 1 to 8 or 1 to 4 carbon atoms. The alkyl group may have a linear, branched or cyclic structure, and may be optionally substituted with at least one substituent.

The term "alkenyl group" used herein may refer to, unless specifically defined otherwise, an alkenyl group having 2 to 20, 2 to 16, 2 to 12, 2 to 8 or 2 to 4 carbon atoms. The alkenyl group may have a linear, branched or cyclic structure, and may be optionally substituted with at least one substituent.

The term "aryl group" used herein may refer to, unless specifically defined otherwise, a monovalent residue having a benzene ring or derived from a compound including a structure in which at least two benzene rings are connected or condensed or a derivative thereof. That is, in the range of the aryl group, an aralkyl group or arylalkyl group, in addition to an aryl group conventionally referred to as an aryl group, may be included. The aryl group may be an aryl group having 6 to 25, 6 to 21, 6 to 18 or 6 to 13 carbon atoms. The aryl group may be a phenyl group, a dichlorophenyl group, a chlorophenyl group, a phenylethyl group, a phenylpropyl group, a benzyl group, a tolyl group, a xylyl group or a naphthyl group, and for example, is a phenyl group.

In the average composition formula of Formula 1, the alkyl group having 1 to 4 carbon atoms may be a linear, branched or cyclic alkyl group. The alkyl group may be optionally substituted with at least one substituent. In the average composition formula of Formula 1, $R^2$ may be, for example, a methyl group.

In the specification, as a substituent capable of being optically substituted to a monovalent hydrocarbon group, an alkyl group, an alkenyl group or an aryl group, a halogen, an epoxy group, an acryloyl group, a methacryloyl group, an isocyanate group, a thiol group or the above-described monovalent hydrocarbon group may be used, but the present application is not limited thereto.

In the average composition formula of Formula 1, a hydrocarbon group having at least two carbon atoms may be, for example, an alkenyl group.

In the average composition formula of Formula 1, k, l, m and n each refer to a molar ratio of a siloxane unit, and when the sum thereof (k+l+m+n) is adjusted to be 1, k may be 0.01 to 0.10, l may be 0 to 0.90, m may be 0 to 0.90, and n may be 0.01 to 0.30.

In one embodiment, in the average composition formula of Formula 1, neither l nor m may be 0. When neither l nor m is 0, l/m may be in the range of 0.4 to 2.0, 0.4 to 1.5 or 0.5 to 1.

The organopolysiloxane represented as the average composition formula of Formula 1 includes a monofunctional siloxane unit (hereinafter referred to as an "M unit") which may be possibly and conventionally represented as ($R_3SiO_{1/2}$) in the related art, a bifunctional siloxane unit (hereinafter referred to as a "D unit") which may be possibly represented as ($R_2SiO_{2/2}$), and a trifunctional siloxane unit (hereinafter referred to as a "T unit") which may be possibly represented as ($RSiO_{3/2}$).

In one embodiment, the organopolysiloxane may have a structure derived from a T unit (hereinafter referred to as a "crosslinked structure") in its structure and a sufficiently long linear structure derived from a D unit. In the average composition formula of the illustrative organopolysiloxane, (l+m)/n may be 5, 7, 8 or 10 or more. In addition, in the average composition formula, (l+m)/k may be 5, 8 or 10 or more. Here, the upper limit of (l+m)/n may be, but is not particularly limited to, for example, 70, 60, 50, 40, 30 or 25. In addition, the upper limit of (l+m)/k may be, but is not particularly limited to, for example, 110, 100, 90, 80, 70, 60, 50 or 40. In Formula 1, (l+m)/(k+l+m+n) may be, for example, 0.5, 0.6 or 0.7 or more. The upper limit of (l+m)/(k+l+m+n) may be, but is not particularly limited to, less than 1 or 0.98 or less. In Formula 1, for example, (l+m)/(l+m+n) may be 0.5, 0.6 or 0.7 or more. The upper limit of (l+m)/(l+m+n) may be, but is not particularly limited to, less than 1 or 0.98 or less. In the specification, the organopolysiloxane having the above-described average composition formula may be referred to as an organopolysiloxane having a partially-crosslinked structure. When the organopolysiloxane has the above structure, suitable physical properties may be exhibited according to an application.

In one embodiment, the organopolysiloxane may include a unit of Formula 2 or 3.

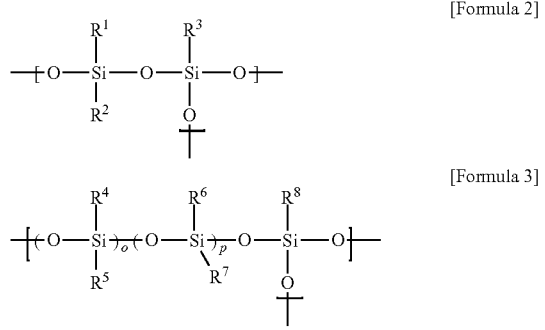

[Formula 2]

[Formula 3]

In Formulas 2 and 3, $R^1$ to $R^8$ are each independently an alkyl group having 1 to 20 carbon atoms, an alkenyl group having 2 to 20 carbon atoms or an aryl group having 6 to 25 carbon atoms, o is 0 to 300, and p is 0 to 300.

In Formulas 2 and 3, $R^3$ or $R^8$ may be, for example, an aryl group.

The illustrative organopolysiloxane may include at least one unit of Formula 2 or 3.

The unit of Formula 2 or 3 is a unit in which a silicon atom of a D unit and a silicon atom of a T unit in a siloxane unit forming the organopolysiloxane are directly bound to each other via an oxygen atom. In one embodiment, as described above, even when the organopolysiloxane is a mixture of at least two components and an average of compositions of respective components is represented as the average composition formula of Formula 1, the organopolysiloxane may include at least one of single components having the unit of Formula 2 or 3. The organopolysiloxane including the unit of Formula 2 or 3 will be prepared, for example, by a reaction of a cyclic siloxane compound with an organopolysiloxane having a cage or partial cage structure or a T unit, as will be described below. Particularly, when the above method is applied, an organopolysiloxane including the unit of Formula 2 or 3, and the minimum number of silicon atoms bound with alkoxy and hydroxyl groups in its structure is possibly prepared.

In one embodiment, the organopolysiloxane may have a ratio (OR/Ak) of an area (OR) of a peak derived from an alkoxy group binding to a silicon atom to an area (Ak) derived from an alkenyl group binding to a silicon atom in the spectrum measured by $^1$H-NMR of 0.05, 0.03, 0.01 or 0.005 or less, or 0. In this range, the organopolysiloxane may exhibit suitable viscosity, and excellently maintain other physical properties. In addition, here, the spectrum measured by $^1$H-NMR is specifically obtained according to a method to be described in the following illustrative embodiment.

In addition, in one embodiment, the organopolysiloxane may have an acid value obtained by KOH titration of 0.05 mgKOH/g or less, 0.03 mgKOH/g or less, 0.01 mgKOH/g or less or 0 mgKOH/g. In this range, the organopolysiloxane may exhibit suitable viscosity, and excellently maintain other physical properties. In addition, here, the acid value obtained by the KOH titration is determined according to a method to be described in the following illustrative embodiment.

In one embodiment, the organopolysiloxane may have a molar ratio (Ar/Si) of the aryl group (Ar) binding to the silicon atom with respect to a total of silicon atoms (Si) in the organopolysiloxane may be 0.3, 0.5 or 0.7 or more. In this range, the polysiloxane or an encapsulant including the polysiloxane may maintain excellent characteristics such as a refractive index, light extraction efficiency, crack resistance, hardness and viscosity. Meanwhile, the upper limit of the molar ratio (Ar/Si) may be, for example, 1.5 or 1.3.

In one embodiment, at least one aryl group binding to a silicon atom of the organopolysiloxane may bind to a silicon atom of a D unit. That is, the illustrative organopolysiloxane may include at least one aryl group binding to a silicon atom of a D unit, and a molar ratio (Ar-D/Si) of the aryl group (Ar-D) binding to a silicon atom of the bifunctional siloxane unit with respect to a silicon atom (Si) of a D unit of the polysiloxane may be 0.2, 0.4 or 0.6 or more. In one embodiment, the upper limit of the molar ratio (Ar-D/Si) may be, but is not particularly limited to, for example, 1.8 or 1.5.

In another example, at least one aryl group binding to a silicon atom of the organopolysiloxane may bind to a silicon atom of a T unit.

In one embodiment, all of the aryl groups that bind to silicon atoms of the organopolysiloxane may bind to silicon atoms of D and/or T unit(s), and satisfy the above-described molar ratio (Ar/Si and/or Ar-D/Si). The polysiloxane or an encapsulant including the same may exhibit excellent characteristics such as a refractive index, light extraction efficiency, crack resistance, hardness and viscosity.

In one embodiment, the organopolysiloxane may have a viscosity at 25° C. of 2,000, 3,000, 4,000, 5,000, 7,000, 9,000, or 9,500 cP or more. In this range, processibility and hardness of the polysiloxane may be suitably maintained. Meanwhile, the upper limit of the viscosity is not particularly limited, and for example, the viscosity may be 100,000, 90,000, 80,000, 70,000 or 65,000 cP or less.

In one embodiment, the organopolysiloxane may have a weight average molecular weight (Mw) of 1,500, 2,000, 3,000, 4,000 or 5,000 or more. The term "weight average molecular weight" used herein refers to a conversion value with respect to standard polystyrene measured by gel permeation chromatography (GPC). In addition, unless specifically defined otherwise in the specification, the term "molecular weight" may refer to a weight average molecular weight. In this range, moldability, hardness and strength of the polysiloxane may be suitably maintained. Meanwhile, the upper limit of the molecular weight is not particularly limited, and may be 14,000, 12,000 or 10,000 or less.

The organopolysiloxane may be, for example, a reaction product of a mixture including a cyclic siloxane compound and an organopolysiloxane including a cage structure or partial cage structure or a T unit. As the cyclic siloxane compound, a compound represented by Formula 4 may be used. In addition, the organopolysiloxane including a cage structure or partial cage structure or a T unit may have an average composition formula of Formula 5 or 6.

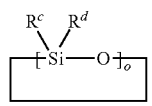

[Formula 4]

[Formula 5]

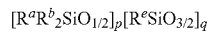

[Formula 6]

In Formulas 4 to 6, $R^a$ is a monovalent hydrocarbon group having at least two carbon atoms, $R^b$ is an alkyl group having 1 to 4 carbon atoms, $R^c$ to $R^e$ are each independently an aryl group having 6 to 25 carbon atoms, an alkyl group having 1 to 20 carbon atoms or a monovalent hydrocarbon group having at least two carbon atoms, o is 3 to 6, p is 1 to 3, and q is 1 to 10.

In Formulas 4 to 6, specific kinds of $R^a$, $R^c$, $R^d$ and $R^e$, specific values of o, p and q, and a ratio of respective components in the mixture may be determined according to an organopolysiloxane having a desired structure.

When the mixture including the compound of Formula 4 and the organopolysiloxane having the average composition formula (s) of Formula (s) 5 and/or 6 is reacted, the organopolysiloxane having a desired structure, for example, the above-described partially-crosslinked structure, may be synthesized at a sufficient molecular weight.

When the mixture is reacted as described above, a desired product having minimum functional groups such as an alkoxy or hydroxyl group binding to a silicon atom in the synthesized organopolysiloxane and thus exhibiting excellent physical properties may be prepared.

In one embodiment, the mixture may further include a compound represented by Formula 7.

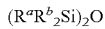 [Formula 7]

In Formula 7, $R^a$ is a monovalent hydrocarbon group having at least two carbon atoms, and $R^b$ is an alkyl group having 1 to 4 carbon atoms.

In Formula 7, specific kinds of $R^a$ and $R^b$ and a mixing ratio of the mixture may be determined according to a structure of a desired organopolysiloxane.

In one embodiment, the reaction of respective components in the mixture may be performed in the presence of a suitable catalyst. Therefore, the mixture may further include a catalyst.

As a catalyst, for example, a base catalyst may be used. A suitable base catalyst may be, but is not limited to, a metal hydroxide such as KOH, NaOH or CsOH; a metal silanolate including an alkali metal compound and a siloxane; or a quaternary ammonium compound such as tetramethylammonium hydroxide, tetraethylammonium hydroxide or tetrapropylammonium hydroxide.

A ratio of the catalyst in the mixture may be suitably selected in consideration of desired reactivity, and for example, may be 0.01 to 30 parts by weight or 0.03 to 5 parts by weight with respect to 100 parts by weight of a total weight of the reaction products in the mixture. In the specification, unless specifically defined otherwise, a unit "parts by weight" refers to a weight ratio between components.

In one embodiment, the reaction of the mixture may be performed in the presence of a suitable solvent. As a solvent, the reaction product in the mixture, that is, a disiloxane or polysiloxane, may be suitably mixed with a catalyst, and any kind of solvent that does not interfere with reactivity may be used. The solvent may be, but is not limited to, an aliphatic hydrocarbon-based solvent such as n-pentane, i-pentane, n-hexane, i-hexane, 2,2,4-trimethyl pentane, cyclohexane or methylcyclohexane; an aromatic solvent such as benzene, toluene, xylene, trimethyl benzene, ethyl benzene or methylethyl benzene; a ketone-based solvent such as methylethylketone, methylisobutylketone, diethylketone, methyl n-propyl ketone, methyl n-butyl ketone, cyclohexanone, methylcyclohexanone or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate or ethyleneglycol diacetate; or an amide-based solvent such as N-methylpyrrolidone, formamide, N-methyl formamide, N-ethyl formamide, N,N-dimethyl acetamide or N,N-diethylacetamide.

The reaction may be performed by adding the catalyst to the reaction product. Here, a reaction temperature may be controlled within a range of, for example, 0 to 150° C. or 30 to 130° C. In addition, a reaction time may be controlled within a range of, for example, 1 hour to 3 days.

Another aspect of the present application provides a semiconductor device. The illustrative semiconductor device may be encapsulated with an encapsulant including the organopolysiloxane described above.

The organopolysiloxane in the encapsulant may be included as it is, or included in a state in which at least some functional groups are reacted with another component. For example, the organopolysiloxane in the encapsulant may be reacted with an organopolysiloxane having a hydrogen atom binding to a silicon atom, which is a crosslinking agent, for example, a crosslinking agent used in a conventional addition-curing reaction.

The encapsulant may further include a tackifier as a component for improving an adhesive property to a metal or organic resin. The tackifier may be, but is not limited to, a silane having at least one or two functional groups selected from the group consisting of an alkenyl group such as a vinyl group, a (meth)acryloyloxy group, a hydrosilyl group (SiH group), an epoxy group, an alkoxy group, an alkoxysilyl group, a carbonyl group and a phenyl group; or an organic organopolysiloxane such as a cyclic or linear siloxane having 2 to 30 or 4 to 20 silicon atoms.

The encapsulant may further include one or at least two of additives including a reaction inhibitor such as 2-methyl-3- butyne-2-ol, 2-phenyl-3-1-butyne-2-ol, 3-methyl-3-pentene-1-in, 3,5-dimethyl-3-hexene-1-in, 1,3,5,7-tetramethyl-1,3,5,7-tetrahexenylcyclotetrasiloxane or ethynylcyclohexane; an inorganic filler such as silica, alumina, zirconia or titania; a carbon-functional silane having an epoxy group and/or alkoxysilyl group, a partial hydrolysis-condensation product thereof or an organopolysiloxane; a thixotropic agent such as a haze-phase silica capable of being used in combination with polyether; a conductivity providing agent such as metal powder of silver, copper or aluminum or various carbon materials; a color adjusting agent such as a pigment or dye; and a fluorescent material, when necessary.

Examples of a semiconductor device encapsulated by an encapsulant include a diode, a transistor, a thyristor, a photocoupler, a CCD, a solid-phase image pick-up diode, a monolithic IC, a hybrid IC, an LSI, a VLSI or an LED.

In one embodiment, the semiconductor device may be a light emitting diode.

The light emitting diode may be one formed by stacking a semiconductor material on a substrate. The semiconductor material may be, but is not limited to, GaAs, GaP, GaAlAs, GaAsP, AlGaInP, GaN, InN, AlN, InGaAlN or SiC. In addition, as the substrate, monocrystalline sapphire, spinel, SiC, Si, ZnO or GaN may be used.

In addition, to prepare the light emitting diode, when necessary, a buffer layer may be formed between a substrate and a semiconductor material. As a buffer layer, GaN or AlN may be used. A method of stacking a semiconductor material on a substrate may be, but is not particularly limited to, MOCVD, HDVPE or liquid growth. In addition, a structure of the light emitting diode may be, for example, a monojunction including an MIS junction, a PN junction and a PIN junction, a heterojunction, or a double heterojunction. In addition, the light emitting diode may be formed using a mono or multiple quantum well structure.

In one embodiment, an emission wavelength of the light emitting diode may be, for example, 250 to 550 nm, 300 to 500 nm or 330 to 470 nm. The emission wavelength may refer to a main emission peak wavelength. As the emission wavelength of the light emitting diode is set in the above range, a white light emitting diode having a longer life span, high energy efficiency and high color expression may be obtained.

The light emitting diode may be encapsulated using, for example, the composition for an encapsulant including the organopolysiloxane. In the composition, when necessary, a component inducing an additional reaction of the organopolysiloxane, for example, a different kind of polysiloxane or catalyst, may be further mixed. The encapsulation of the light emitting diode may be performed using only the composition, and in some cases, another encapsulant may be used in combination with the composition. When two kinds of encapsulants are used in combination, after the encapsulation using the composition, the encapsulated light emitting diode may also be encapsulated with another encapsulant, or the light emitting diode may be encapsulated with another encapsulant and then encapsulated again with the composition. As another encapsulant, an epoxy resin, a silicon resin, an acryl resin, a urea resin, an imide resin or glass may be used.

To encapsulate the light emitting diode with the composition, for example, a method including previously injecting the composition into a mold-type mold, dipping a lead frame to which the light emitting diode is fixed therein and curing the composition, or a method including injecting the composition into a mold into which the light emitting diode is inserted and curing the composition may be used. As a method of injecting the composition, injection by a dispenser, transfer molding or injection molding may be used. In addition, as other encapsulating methods, a method of dropping the composition on the light emitting diode, coating the composition by screen printing or using a mask, and curing the composition, and a method of injecting the composition into a cup in which the light emitting diode is disposed on its bottom by a dispenser and curing the composition may be included.

In addition, the composition may be used as a diamond material fixing the light emitting diode to a lead terminal or package, or a passivation layer or package substrate on the light emitting diode when necessary.

When it is necessary to cure the composition, the curing is not particularly limited, and may be performed, for example, by maintaining the composition at a temperature of 60 to 200° C. for 10 minutes to 5 hours, or in phases with at least two steps at a suitable temperature and for a suitable time.

A shape of the encapsulant is not particularly limited, and for example, may be a bullet-type lens, plane, or thin film shape.

In addition, additional enhancement of performance of the light emitting diode may be promoted according to the conventional method known in the related art. To enhance the performance, for example, a method of disposing a reflective layer or light collecting layer on a back surface of the light emitting diode, a method of forming a complementary coloring part on its bottom, a method of disposing a layer absorbing light having a shorter wavelength than the main emission peak on the light emitting diode, a method of encapsulating the light emitting diode and further molding the light emitting diode with a lightweight material, a method of inserting the light emitting diode into a through hole to be fixed, or a method of contacting the light emitting diode with a lead member by flip-chip contact to extract light from a direction of the substrate may be used.

The light emitting diode may be effectively applied to, for example, backlights for liquid crystal displays (LCDs), lighting apparatuses, various kinds of sensors, light sources of a printer and a copy machine, light sources for a mobile gauge, signal lights, pilot lights, display devices, light sources of planar-type light emitting diodes, displays, decorations or various kinds of lightings.

Advantageous Effects

An illustrative organopolysiloxane exhibits excellent processibility and workability. In addition, when the organopolysiloxane is used as an encapsulant, it exhibits excellent light extraction efficiency, crack resistance, hardness, thermal and shock resistance and an adhesive property. Moreover, the organopolysiloxane can provide an encapsulant exhibiting stable durability and reliability under severe conditions for a long time and having no whitening and surface stickiness.

Best Modes of the Invention

Hereinafter, an organopolysiloxane according to the present application will be described in further detail with reference to Examples according to the present application and Comparative Examples not according to the present application, but the scope of the present application is not limited to the following Examples.

Hereinafter, the abbreviation "Vi" refers to a vinyl group, the abbreviation "Ph" refers to a phenyl group, and the abbreviation "Me" refers to a methyl group.

In addition, hereinafter, each physical property is measured by the following method.

1. Measurement of $^1$H-NMR for Organopolysiloxane $^1$H-NMR analysis with respect to organopolysiloxanes was performed under the following conditions:

<$^1$H-NMR Analysis>

Measurement Apparatus Varian Unity Inova 500 MHz NMR

Solvent used: acetone-d6

Measuring Conditions:

Pulse sequence: s2pul

Sweep width: 8012.8 Hz

Acquisition time: 2.045 seconds

Delay time: 2 seconds

Pulse width: 45 degree pulse (8.10 μsec)

Number of scan: 16

2. Measurement of Acid Value for Organopolysiloxane

A solvent for measurement was prepared by mixing 500 mL of toluene, 495 mL of isopropylalcohol (IPA) and 5 mL of distilled water. In addition, a 0.1 N KOH solution (solvent: IPA) was prepared as a base solution, and alpha-naphtholbenzein (pH: 0.8 to 8.2 yellow, 10.0 blue green) was prepared as an indicator. Subsequently, after approximately 1 to 2 g of a sample was taken and dissolved in 6 g of the solvent for measurement, the indicator was added thereto and then the resulting mixture was titrated using the base solution. An acid value was measured using an amount of the base solution used at a time to complete the titration in units of mg KOH/g.

EXAMPLE 1

Synthesis of Organopolysiloxane 60.00 g of octamethylcyclotetrasiloxane, 106.96 g of octaphenylcyclotetrasiloxane, 17.44 g of octaphenyl-POSS and 12.56 g of divinyltetramethyldisiloxane were mixed, and 0.63 mL of tetramethylammonium hydroxide (TMAH) was mixed into the mixture as a catalyst. Afterward, the mixture into which the catalyst was mixed was reacted at 115° C. for approximately 20 hours, thereby obtaining a transparent oil-type polysiloxane represented by Formula A. The organopolysiloxane had a viscosity at 25° C. of 21,000 cP and a molecular weight of approximately 6,400. In addition, from the spectrum measured by $^1$H-NMR for the organopolysiloxane, a peak derived from an alkoxy group was not observed, and an acid value was measured at approximately 0.006 mg KOH/g.

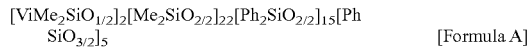  [Formula A]

Curable Composition

An organopolysiloxane was prepared by mixing 80 g of the prepared organopolysiloxane of Formula A, 25 g of an organopolysiloxane of Formula L, 5 g of an organopolysiloxane of Formula M and 25 g of an organopolysiloxane of Formula N, and further mixing a suitable amount of a platinum catalyst.

  [Formula L]

  [Formula M]

  [Formula N]

EXAMPLE 2

Synthesis of Organopolysiloxane

A polysiloxane was synthesized by the method described in Example 1, except that the amount at which divinyltetramethyldisiloxane was mixed was changed to 6.28 g. The polysiloxane was represented by Formula B and present in transparent oil. The polysiloxane had a viscosity at 25° C. of 58,600 cP and a molecular weight of approximately 9,700. In addition, in the spectrum measured by $^1$H-NMR, a peak derived from an alkoxy group was not observed, and an acid value was measured at approximately 0.009 mg KOH/g.

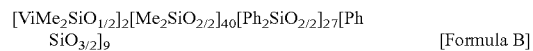  [Formula B]

Curable Composition

An organopolysiloxane was prepared by mixing 80 g of the prepared organopolysiloxane of Formula B, 25 g of the organopolysiloxane of Formula L, 5 g of the organopolysiloxane of Formula M and 25 g of the organopolysiloxane of Formula N, and further mixing a suitable amount of a platinum catalyst.

  [Formula L]

  [Formula M]

  [Formula N]

EXAMPLE 3

Synthesis of Organopolysiloxane

A polysiloxane was synthesized by the method described in Example 1, except that the amounts at which octaphenyl-POSS and divinyltetramethyldisiloxane were mixed were changed to 34.88 g and 15.72 g, respectively. The polysiloxane was represented by Formula C and present in transparent oil. The polysiloxane had a viscosity at 25° C. of 33,200 cP and a molecular weight of approximately 4,600. In addition, in the spectrum measured by $^1$H-NMR, a peak derived from an alkoxy group was not observed, and an acid value was measured at approximately 0.008 mg KOH/g.

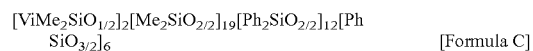  [Formula C]

Curable Composition

An organopolysiloxane was prepared by mixing 80 g of the prepared organopolysiloxane of Formula C, 25 g of the organopolysiloxane of Formula L, 5 g of the organopolysiloxane of Formula M and 25 g of the organopolysiloxane of Formula N, and further mixing a suitable amount of a platinum catalyst.

  [Formula L]

  [Formula M]

  [Formula N]

EXAMPLE 4

Synthesis of Organopolysiloxane

A polysiloxane was synthesized by the method described in Example 1, except that the amounts at which octamethylcyclotetrasiloxane, octaphenylcyclotetrasiloxane and divinyltetramethyldisiloxane were mixed were changed to 55.00 g, 120.34 g and 18.85 g, respectively. The polysiloxane was represented by Formula D and present in transparent oil. The polysiloxane had a viscosity at 25° C. of 24,400 cP and a molecular weight of approximately 4,200. In addition, in the spectrum measured by $^1$H-NMR, a peak derived from an alkoxy group was not observed, and an acid value was measured at approximately 0.008 mg KOH/g.

$$[ViMe_2SiO_{1/2}]_2[Me_2SiO_{2/2}]_{14}[Ph_2SiO_{2/2}]_{11}[PhSiO_{3/2}]_3 \quad \text{[Formula D]}$$

Curable Composition

An organopolysiloxane was prepared by mixing 80 g of the prepared organopolysiloxane of Formula D, 25 g of the organopolysiloxane of Formula L, 5 g of the organopolysiloxane of Formula M and 25 g of the organopolysiloxane of Formula N, and further mixing a suitable amount of a platinum catalyst.

$$(HMe_2SiO_{1/2})(PhSiO_{3/2})_3 \quad \text{[Formula L]}$$

$$(HMe_2SiO_{1/2})_2(Ph_2SiO_{2/2})_{1.5} \quad \text{[Formula M]}$$

$$(ViMe_2SiO_{1/2})_1(PhSiO_{3/2})_3 \quad \text{[Formula N]}$$

EXAMPLE 5

Synthesis of Organopolysiloxane

A polysiloxane was synthesized by the method described in Example 4, except that the amount at which divinyltetramethyldisiloxane was mixed was changed to 12.56 g. The polysiloxane was represented by Formula E and present in transparent oil. The polysiloxane had a viscosity at 25° C. of 47,000 cP and a molecular weight of approximately 5,500. In addition, in the spectrum measured by $^1$H-NMR, a peak derived from an alkoxy group was not observed, and an acid value was measured at approximately 0.007 mg KOH/g.

$$[ViMe_2SiO_{1/2}]_2[Me_2SiO_{2/2}]_{21}[Ph_2SiO_{2/2}]_{17}[PhSiO_{3/2}]_4 \quad \text{[Formula E]}$$

Curable Composition

An organopolysiloxane was prepared by mixing 110 g of the prepared organopolysiloxane of Formula E, 25 g of the organopolysiloxane of Formula L, 5 g of the organopolysiloxane of Formula M and 25 g of the organopolysiloxane of Formula N, and further mixing a suitable amount of a platinum catalyst.

$$(HMe_2SiO_{1/2})(PhSiO_{3/2})_3 \quad \text{[Formula L]}$$

$$(HMe_2SiO_{1/2})_2(Ph_2SiO_{2/2})_{1.5} \quad \text{[Formula M]}$$

$$(ViMe_2SiO_{1/2})_1(PhSiO_{3/2})_3 \quad \text{[Formula N]}$$

EXAMPLE 6

Synthesis of Organopolysiloxane

A polysiloxane was synthesized by the method described in Example 1, except that 183.71 g of tetramethyltetraphenylcyclotetrasiloxane was mixed instead of octamethylcyclotetrasiloxane and octaphenylcyclotetrasiloxane, and the amount at which divinyltetramethyldisiloxane was mixed was changed to 12.10 g. The polysiloxane was represented by Formula F and present in transparent oil. The polysiloxane had a viscosity at 25° C. of 19,800 cP and a molecular weight of approximately 4,800. In addition, from the spectrum measured by $^1$H-NMR for the organopolysiloxane, a peak derived from an alkoxy group was not observed, and an acid value was measured at approximately 0.008 mg KOH/g.

$$[ViMe_2SiO_{1/2}]_2[MePhSiO_{2/2}]_{32}[PhSiO_{3/2}]_4 \quad \text{[Formula F]}$$

Curable Composition

An organopolysiloxane was prepared by mixing 110 g of the prepared organopolysiloxane of Formula F, 25 g of the organopolysiloxane of Formula L, 5 g of the organopolysiloxane of Formula M and 25 g of the organopolysiloxane of Formula N, and further mixing a suitable amount of a platinum catalyst.

$$(HMe_2SiO_{1/2})(PhSiO_{3/2})_3 \quad \text{[Formula L]}$$

$$(HMe_2SiO_{1/2})_2(Ph_2SiO_{2/2})_{1.5} \quad \text{[Formula M]}$$

$$(ViMe_2SiO_{1/2})_1(PhSiO_{3/2})_3 \quad \text{[Formula N]}$$

EXAMPLE 7

Synthesis of Organopolysiloxane 30.0 g of octamethylcyclotetrasiloxane, 53.5 g of octaphenylcyclotetrasiloxane, 8.7 g of octaphenyl-POSS and 6.3 g of divinyltetramethyldisiloxane were mixed, and 0.3 mL of TMAH was mixed into the mixture as a catalyst. Afterward, the mixture into which the catalyst was mixed was reacted at 115° C. for approximately 20 hours. A low molecular weight material was removed from the reaction product after the end of the reaction, thereby obtaining a transparent oil-type polysiloxane represented by Formula G. The organopolysiloxane had a viscosity at 25° C. of 21,100 cP and a molecular weight of approximately 6,100. In addition, from the spectrum measured by $^1$H-NMR for the organopolysiloxane, a peak derived from an alkoxy group was not observed, and an acid value was measured at approximately 0.01 mg KOH/g.

$$[ViMe_2SiO_{1/2}]_2[Me_2SiO_{2/2}]_{23}[Ph_2SiO_{2/2}]_{15}[PhSiO_{3/2}]_4 \quad \text{[Formula G]}$$

Curable Composition

An organopolysiloxane was prepared by mixing 110 g of the prepared organopolysiloxane of Formula G, 25 g of the organopolysiloxane of Formula L, 5 g of the organopolysiloxane of Formula M and 25 g of the organopolysiloxane of Formula N, and further mixing a suitable amount of a platinum catalyst.

$$(HMe_2SiO_{1/2})(PhSiO_{3/2})_3 \quad \text{[Formula L]}$$

$$(HMe_2SiO_{1/2})_2(Ph_2SiO_{2/2})_{1.5} \quad \text{[Formula M]}$$

$$(ViMe_2SiO_{1/2})_1(PhSiO_{3/2})_3 \quad \text{[Formula N]}$$

EXAMPLE 8

Synthesis of Organopolysiloxane

A polysiloxane was synthesized by the method described in Example 7, except that the amount at which octaphenyl-POSS was mixed was changed to 4.4 g. The polysiloxane was represented by Formula H and present in transparent oil. The polysiloxane had a viscosity at 25° C. of 10,200 cP and a molecular weight of approximately 5,600. In addition, in the spectrum measured by $^1$H-NMR, a peak derived from an alkoxy group was not observed, and an acid value was measured at approximately 0.009 mg KOH/g.

$$[ViMe_2SiO_{1/2}]_2[Me_2SiO_{2/2}]_{24}[Ph_2SiO_{2/2}]_{16}[PhSiO_{3/2}]_2 \quad \text{[Formula H]}$$

Curable Composition

An organopolysiloxane was prepared by mixing 110 g of the prepared organopolysiloxane of Formula H, 25 g of the organopolysiloxane of Formula L, 5 g of the organopolysiloxane of Formula M and 25 g of the organopolysiloxane of Formula N, and further mixing a suitable amount of a platinum catalyst.

$(HMe_2SiO_{1/2})(PhSiO_{3/2})_3$ [Formula L]

$(HMe_2SiO_{1/2})_2(Ph_2SiO_{2/2})_{1.5}$ [Formula M]

$(ViMe_2SiO_{1/2})_1(PhSiO_{3/2})_3$ [Formula N]

EXAMPLE 9

Synthesis of Organopolysiloxane

A polysiloxane was synthesized by the method described in Example 7, except that the amount at which divinyltetramethyldisiloxane was mixed was changed to 9.4 g. The polysiloxane was represented by Formula I and present in transparent oil. The polysiloxane had a viscosity at 25° C. of 12,200 cP and a molecular weight of approximately 4,700. In addition, in the spectrum measured by $^1$H-NMR, a peak derived from an alkoxy group was not observed, and an acid value was measured at approximately 0.008 mg KOH/g.

$[ViMe_2SiO_{1/2}]_2[Me_2SiO_{2/2}]_{17}[Ph_2SiO_{2/2}]_{11}[PhSiO_{3/2}]_4$ [Formula I]

Curable Composition

An organopolysiloxane was prepared by mixing 110 g of the prepared organopolysiloxane of Formula I, 25 g of the organopolysiloxane of Formula L, 5 g of the organopolysiloxane of Formula M and 25 g of the organopolysiloxane of Formula N, and further mixing a suitable amount of a platinum catalyst.

$(HMe_2SiO_{1/2})(PhSiO_{3/2})_3$ [Formula L]

$(HMe_2SiO_{1/2})_2(Ph_2SiO_{2/2})_{1.5}$ [Formula M]

$(ViMe_2SiO_{1/2})_1(PhSiO_{3/2})_3$ [Formula N]

EXAMPLE 10

Synthesis of Organopolysiloxane

A polysiloxane was synthesized by the method described in Example 7, except that the amounts at which octamethylcyclotetrasiloxane, octaphenylcyclotetrasiloxane and divinyltetramethyldisiloxane were mixed were changed to 27.2 g, 60.2 g and 7.9 g, respectively. The polysiloxane was represented by Formula J and present in transparent oil. The polysiloxane had a viscosity at 25° C. of 33,200 cP and a molecular weight of approximately 4,600. In addition, in the spectrum measured by $^1$H-NMR, a peak derived from an alkoxy group was not observed, and an acid value was measured at approximately 0.007 mg KOH/g.

$[ViMe_2SiO_{1/2}]_2[Me_2SiO_{2/2}]_{18}[Ph_2SiO_{2/2}]_{15}[PhSiO_{3/2}]_2$ [Formula J]

Curable Composition

An organopolysiloxane was prepared by mixing 110 g of the prepared organopolysiloxane of Formula J, 25 g of the organopolysiloxane of Formula L, 5 g of the organopolysiloxane of Formula M and 25 g of the organopolysiloxane of Formula N, and further mixing a suitable amount of a platinum catalyst.

$(HMe_2SiO_{1/2})(PhSiO_{3/2})_3$ [Formula L]

$(HMe_2SiO_{1/2})_2(Ph_2SiO_{2/2})_{1.5}$ [Formula M]

$(ViMe_2SiO_{1/2})_1(PhSiO_{3/2})_3$ [Formula N]

EXAMPLE 11

Synthesis of Organopolysiloxane

A polysiloxane was synthesized by the method described in Example 7, except that 12.5 g of a polysiloxane represented as Formula $[ViMe_2SiO_{1/2}][PhSiO_{3/2}]_{3.5}$ and having a molecular weight of 1,520 was used instead of octaphenyl-POSS, and the amount at which divinyltetramethyldisiloxane was mixed was changed to 6.1 g. The polysiloxane was represented by Formula K and present in transparent oil. The polysiloxane had a viscosity at 25° C. of 15,500 cP and a molecular weight of approximately 5,300. In addition, in the spectrum measured by $^1$H-NMR, a peak derived from an alkoxy group was not observed, and an acid value was measured at approximately 0.012 mg KOH/g.

$[ViMe_2SiO_{1/2}]_2[Me_2SiO_{2/2}]_{20}[Ph_2SiO_{2/2}]_{13}[PhSiO_{3/2}]_4$ [Formula K]

Curable Composition

An organopolysiloxane was prepared by mixing 110 g of the prepared organopolysiloxane of Formula K, 25 g of the organopolysiloxane of Formula L, 5 g of the organopolysiloxane of Formula M and 25 g of the organopolysiloxane of Formula N, and further mixing a suitable amount of a platinum catalyst.

$(HMe_2SiO_{1/2})(PhSiO_{3/2})_3$ [Formula L]

$(HMe_2SiO_{1/2})_2(Ph_2SiO_{2.2})_{1.5}$ [Formula M]

$(ViMe_2SiO_{1/2})_1(PhSiO_{3/2})_3$ [Formula N]

COMPARATIVE EXAMPLE 1

An organopolysiloxane was prepared by the same method as described in Example 1, except that the organopolysiloxane of Formula A was not used.

COMPARATIVE EXAMPLE 2

An organopolysiloxane was prepared by the same method as described in Example 1, except that an organopolysiloxane of Formula O was used instead of the organopolysiloxane of Formula A.

$[ViMe_2SiO_{1/2}]_2[Me_2SiO_{2/2}]15[Ph_2SiO_{2/2}]_{25}$ [Formula O]

1. Evaluation of High-Temperature Thermal Resistance

A 1 mm-thick planar specimen was prepared by coating an organopolysiloxane on an organic substrate, and performing curing while maintaining the composition at 60° C. for 30 minutes and then at 150° C. for 1 hour. Afterward, the specimen was left at 150° C. for 100 hours, and a light transmittance in a thickness direction of the specimen was measured at a wavelength of 450 nm using a UV-VIS spectrometer, and high temperature thermal resistance was evaluated according to the following criteria.

<Evaluation Criteria>

◯: light transmittance of 95% or more x: light transmittance of less than 95%

2. Evaluation of Characteristics of Device

Characteristics of a device were evaluated using a 6020 LED package prepared with polyphthalamide (PPA). Particularly, the curable composition was dispensed in a PPA cup, maintained at 70° C. for 30 minutes, and cured at 150° C. for 1 hour, and thereby a surface-mounted LED was manufactured. Afterward, a thermal shock test and a long-term reliability test were performed according to the following methods.

Thermal Shock Test

The manufactured LED was maintained at −40° C. for 30 minutes, and then maintained at 100° C. for 30 minutes, which was set as one cycle, and then the cycle was repeated 10 times. The LED was maintained at room temperature, and then thermal shock resistance thereof was evaluated by examining a peeling state. In the evaluation, 10 LEDs manufactured with the same curable composition were each subjected to the above-described test, and the number of peeled LEDs is shown in Table 1.

TABLE 1

|  | High-Temperature Thermal Resistance | Thermal and Shock Resistance |
| --- | --- | --- |
| Example 1 | ○ | 0/10 |
| Example 2 | ○ | 0/10 |
| Example 3 | ○ | 0/10 |
| Example 4 | ○ | 0/10 |
| Example 5 | ○ | 0/10 |
| Example 6 | ○ | 0/10 |
| Example 7 | ○ | 0/10 |
| Example 8 | ○ | 0/10 |
| Example 9 | ○ | 0/10 |
| Example 10 | ○ | 0/10 |
| Example 11 | ○ | 0/10 |
| Example 12 | ○ | 0/10 |
| Example 13 | ○ | 0/10 |
| Comparative Example 1 | ○ | 7/10 |
| Comparative Example 2 | ○ | 5/10 |

The invention claimed is:

1. An organopolysiloxane having an average composition formula of Formula 1:

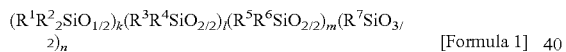

[Formula 1]

$(R^1R^2_2SiO_{1/2})_k(R^3R^4SiO_{2/2})_l(R^5R^6SiO_{2/2})_m(R^7SiO_{3/2})_n$ where $R^1$ is a monovalent hydrocarbon group having at least two carbon atoms, $R^2$ is an alkyl group having 1 to 4 carbon atoms, $R^3$ is an aryl group having 6 to 25 carbon atoms, $R^4$ is an alkyl group having 1 to 20 carbon atoms, an alkenyl group having 2 to 20 carbon atoms or an aryl group having 6 to 25 carbon atoms, $R^5$ and $R^6$ are each independently an alkyl group having 1 to 20 carbon atoms, an alkenyl group having 2 to 20 carbon atoms or an aryl group having 6 to 25 carbon atoms, $R^7$ is an alkyl group having 1 to 20 carbon atoms or an aryl group having 6 to 25 carbon atoms, k is a positive number, l and m are each independently a positive number, n is a positive number, and (l+m)/n is 5 or more, and wherein the organopolysiloxane is a reaction product of a mixture comprising a compound of Formula 4; and an organopolysiloxane represented as an average composition formula of Formula 5 or 6:

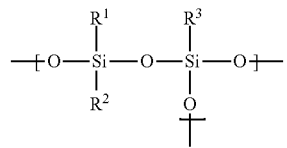

[Formula 4]

[Formula 5]

$[R^eSiO_{3/2}]$

[Formula 6]

$[R^aR^b_2SiO_{1/2}]_p[R^eSiO_{3/2}]_q$ where $R^a$ is a monovalent hydrocarbon group having at least two carbon atoms, $R^b$ is an alkyl group having 1 to 4 carbon atoms, $R^c$ and $R^d$ are each independently an alkyl group having 1 to 20 carbon atoms, an alkenyl group having 2 to 20 carbon atoms or an aryl group having 6 to 25 carbon atoms, $R^e$ is an alkyl group having 1 to 20 carbon atoms or an aryl group having 6 to 25 carbon atoms, o is 3 to 6, p is 1 to 3, and q is 1 to 10.

2. The organopolysiloxane of claim 1, wherein, l/m is from 0.4 to 2.0 and both of l and m are not 0 in Formula 1.

3. The organopolysiloxane of claim 1, wherein (l+m)/k in Formula 1 is 5 or more.

4. The organopolysiloxane of claim 1, wherein (l+m)/(k+l+m+n) is 0.5 or more.

5. The organopolysiloxane of claim 1, wherein (l+m)/(l+m+n) is 0.5 or more.

6. The organopolysiloxane of claim 1, comprising a siloxane unit of Formula 2:

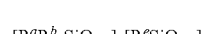

[Formula 2]

where $R^1$ to $R^3$ are each independently an alkyl group having 1 to 20 carbon atoms, an alkenyl group having 2 to 20 carbon atoms or an aryl group having 6 to 25 carbon atoms.

7. The organopolysiloxane of claim 1, comprising a siloxane unit of Formula 3:

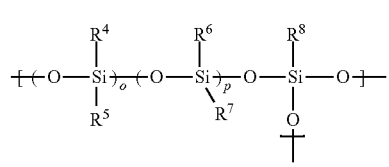

[Formula 3]

where $R^4$ is an aryl group having 6 to 25 carbon atoms, $R^5$ to $R_7$ are each independently an alkyl group having 1 to 20 carbon atoms, an alkenyl group having 2 to 20 carbon atoms or an aryl group having 6 to 25 carbon atoms, $R^8$ is an alkyl group having 1 to 20 carbon atoms or an aryl group having 6 to 25 carbon atoms, o is 0 to 300, and p is 0 to 300.

8. The organopolysiloxane of claim 1, wherein a ratio of an area of a peak derived from an alkoxy group binding to a silicon atom to an area derived from an alkenyl group binding to a silicon atom in $^1$H-NMR spectrum is 0.05 or less.

9. The organopolysiloxane of claim 1, which has an acid value obtained by KOH titration of 0.05 mgKOH/g or less.

10. The organopolysiloxane of claim 1, wherein the mixture further comprising a compound of Formula 7:

$(R^aR^b_2Si)_2O$ [Formula 7]

where $R^a$ and $R^b$ are the same as described in Formula 6.

11. A semiconductor device encapsulated with an encapsulant including the organopolysiloxane of claim 1.

12. A light emitting diode encapsulated with an encapsulant including the organopolysiloxane of claim 1.

13. A liquid crystal display comprising the light emitting diode of claim 12.

14. A lighting apparatus comprising the light emitting diode of claim 12.

* * * * *